United States Patent [19]

Safari et al.

[11] 4,422,003
[45] Dec. 20, 1983

[54] PERFORATED PZT POLYMER COMPOSITES

[75] Inventors: Ahmad Safari; Robert E. Newnham; Leslie E. Cross; Walter A. Schulze, all of State College, Pa.

[73] Assignee: The United States of America as represented by the Secretary of the Navy, Washington, D.C.

[21] Appl. No.: 408,320

[22] Filed: Aug. 16, 1982

[51] Int. Cl.$^3$ ............................................. H01L 41/08
[52] U.S. Cl. ................................... 310/358; 252/62.9
[58] Field of Search ............................... 310/357–359; 29/25, 35; 252/62.9

[56] References Cited

U.S. PATENT DOCUMENTS

| | | | |
|---|---|---|---|
| 2,420,864 | 5/1947 | Chilowski | 310/358 |
| 3,070,775 | 12/1962 | Andrews, Jr. | 310/357 X |
| 3,213,027 | 10/1965 | Fatuzzo | 310/357 X |
| 3,781,955 | 1/1974 | Lauvinenko et al. | 310/358 |
| 3,820,208 | 6/1974 | Baldy | 310/358 |
| 4,056,742 | 11/1977 | Tibbetts | 310/357 |
| 4,227,111 | 10/1980 | Cross et al. | 310/358 |
| 4,395,719 | 7/1983 | Majewski | 310/357 X |

OTHER PUBLICATIONS

Perforated PZT-Polymer Composite for Piezoelectric Transducer Applications, Safari et al., *Ferroelectrics* 1982, vol. 41 pp. 197-205, public disclosure date 8-21-81.

*Primary Examiner*—Mark O. Budd
*Attorney, Agent, or Firm*—Robert F. Beers; Arthur A. McGill; Prithvi C. Lall

[57] ABSTRACT

Composites of lead zirconate titanate (PZT) and inactive polymers with 3-1 and 3-2 patterns and a method of fabrication thereof are described. Fabrication is accomplished by drilling holes in sintered PZT blocks and filling the holes with epoxy or some other inactive polymer. The influence of hole size and volume fraction PZT on the hydrostatic properties of the composite is evaluated. By decoupling the piezoelectric coefficients $d_{33}$ and $d_{31}$ in the composite, the hydrostatic coefficients are greatly enhanced.

10 Claims, 7 Drawing Figures

PERFORATED PZT POLYMER COMPOSITES

BACKGROUND OF THE INVENTION

This invention is related to piezoelectric materials and, more particularly, to 3-1 and 3-2 phase connected PZT-polymer composites for transducer applications and the like.

A widely used piezoelectric transducer is made from solid lead zirconate titanate (PZT) which is a dense (density 7.9 grams per cc) ceramic with high dielectric permittivity ($\epsilon_{33}$). However, solid PZT is a poor transducer material in some respects as coefficients such as piezoelectric voltage coefficients $g_{33}$ and $g_h$ are low due to high dielectric permittivity $\epsilon_{33}$. The coefficients $d_h$ which is the difference between $d_{33}$ and twice $d_{31}$ is also low. It is thus desirable to have transducer materials which have high hydrostatic piezoelectric voltage coefficient $g_h$ and product $d_h g_h$ used as a figure of merit for hydrophone applications.

SUMMARY OF THE INVENTION

A PZT-polymer composite according to the teachings of subject invention is fabricated by filling a perforated sintered PZT block with a suitable polymer. Similar structures can also be made by extrusion techniques. On sample optimized for hydrophone performance, the dielectric constants of both the 3-1 and 3-2 composites are much lower than that of solid PZT and the piezoelectric coefficient $d_h$ is much higher than that of solid PZT. Due to the geometry of these composites, $d_{33}$ of the composite is almost equal to that of solid PZT even though a significant volume fraction of PZT block is filled with an inactive polymer phase. As a result of this, the piezoelectric voltage coefficient $g_{33}$ and $g_h$ of the composites are much higher than the corresponding values of PZT and the product of $d_h$ and $g_h$ is very high compared to that of solid PZT. The density of these composites is lower (3-4 gm/cc) than that of solid PZT. Because of the low density of the composites, a better mechanical coupling with seawater is possible when these materials are used for hydrophone applications in seawater.

An object of subject invention is to fabricate a PZT-polymer composite for transducer applications.

Another object of subject invention is to fabricate PZT-polymer composites which have high hydrostatic voltage coefficient $g_h$.

Still another object of subject invention is to fabricate a PZT-polymer composite which has relatively low density;

Another object of subject invention is to fabricate PZT-polymer composites which has a high value of $d_h g_h$ which measures figure of matter of a transducer.

Other objects, advantages and novel features of the invention will become apparent from the following detailed description thereof when considered in conjunction with the accompanying drawings wherein:

DESCRIPTION OF A PREFERRED EMBODIMENT

Figure 1:
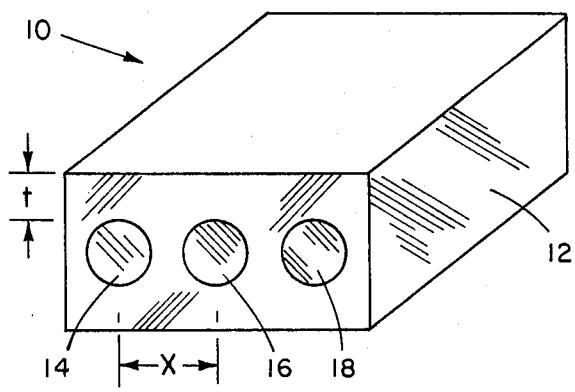
FIG. 1 is a schematic representation of PZT-epoxy composites with 3-1 connectivity.
Figure 2:
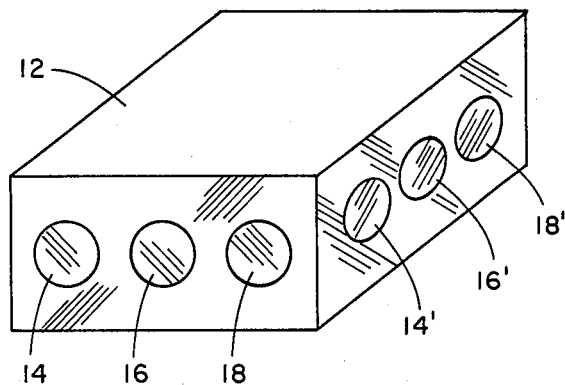
FIG. 2 is a schematic representation of PZT-epoxy composites with 3-2 connectivity.

Referring to the drawings where like numbers represent like parts throughout, FIG. 1 shows a schematic representation of a piece 10 of PZT-polymer composite built according to the teachings of subject invention. PZT matrix or sample 12 has a plurality of holes or voids such as 14, 16 and 18 drilled therethrough along an axis perpendicular to the sample polarization direction. PZT-polymer composites were then prepared by filling completely or partially the perforated block with a polymer. In case of partial filling of the holes, the holes were covered at the surface. FIG. 2 shows a PZT-polymer composite of 3-2 connectivity having completely or partially filled parallel holes 14, 16 and 18 perpendicular to the parallel voids 14′, 16′ and 18′ completely or partially filled by epoxy. It is to be noted that axes of holes 14, 16 and 18 and those of holes 14′, 16′ and 18′ are perpendicular to the direction of polarization of the PZT sample 12. To prepare the ceramic material, 95 weight % of PZT (501A from Ultrasonic Powders, Inc., South Plainfield, N.J.) was mixed with 5 weight % of 15% PVA (polyvinyl alcohol) solution. After mixing and drying the powder, square pellets measuring preferably 2 cm on edge and 4–8 mm thick, were pressed at 20,000 psi, i.e. 140 MPa (1 MPa=1 mega pascal=$10^6$ newton/meter$^2$). The pellets were placed on a platinum sheet and the binder was burned out at 550° C. for one hour. Sintering was carried out in a sealed alumina crucible using a silicon carbide resistance furnace at a heating rate of 200° C. per hour with a soak period of one hour at 1285° C. PbO-rich atmosphere was maintained with sacrificial ceramic pellets of composite 97 mole % PZT and 3 mole % PbO inside the crucible. After firing, the samples were polished and cut into small pieces of various dimensions. Air-dried silver paste electrodes (preferably from Materials for Electronics, Inc., Jamaica, N.Y.) were applied to the pellets. Poling was done in a stirred oil bath at 140° C. at a field of 25 KV/cm for three minutes. After poling, three or four holes were drilled perpendicular to the poling direction using an ultrasonic cutter such as one from Sheffield Ultrasonic Machine Tool, Dayton, Ohio. Sample with different hole sizes and hole separation were prepared. The drilled samples were then placed in a small plastic tube and a commercial polymer such as vinylcyclohexene dioxide-epoxy such as Spurrs low viscosity embedding media, No. 5135, Polysciences Inc., Warrington, Pa. was poured into the tube. The epoxy was cured at 70° C. for eight hours. Finally, the composites were polished on silicon carbide paper to expose the PZT and to insure smooth and parallel faces of the disc. Electrodes of air-dried silver paste were applied and the composites were aged for at least 24 hours prior to any measurement. It should be noted that the materials and tools used in the fabrication of the composites are cited for illustrative purposes only and any obvious substitutions thereof can be made without deviating from the fabrication techniques of subject invention.

Figure 3:
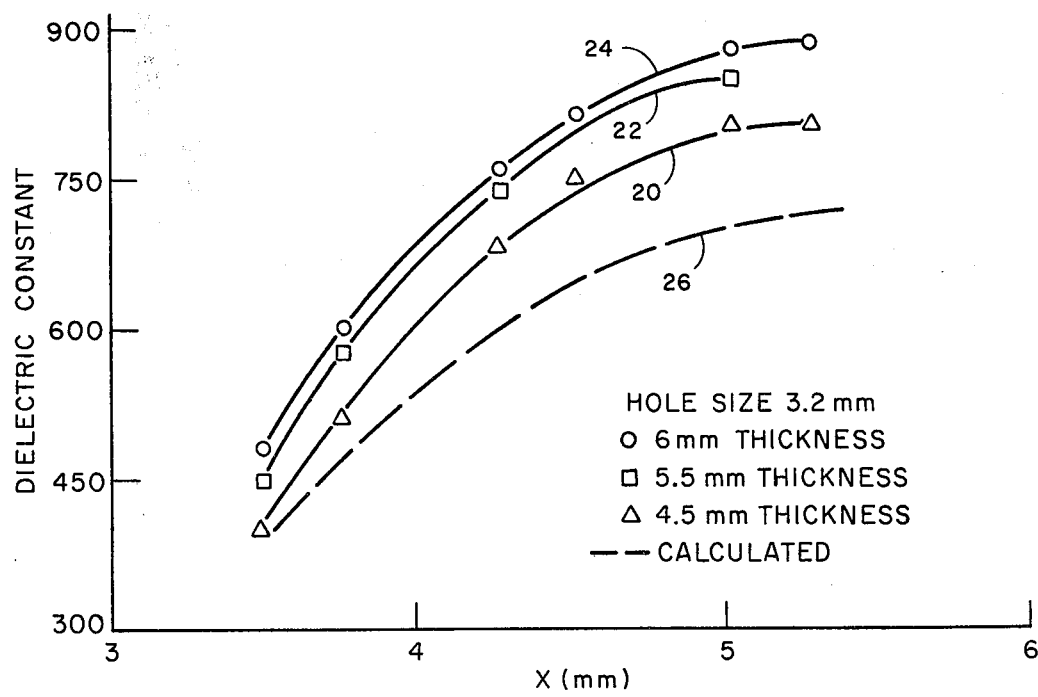
FIG. 3 is a graphical representation of variation of dielectric constant as a function of center-to-center distance between adjacent holes for PZT-polymer composites with 3-1 connectivity.
Figure 4:
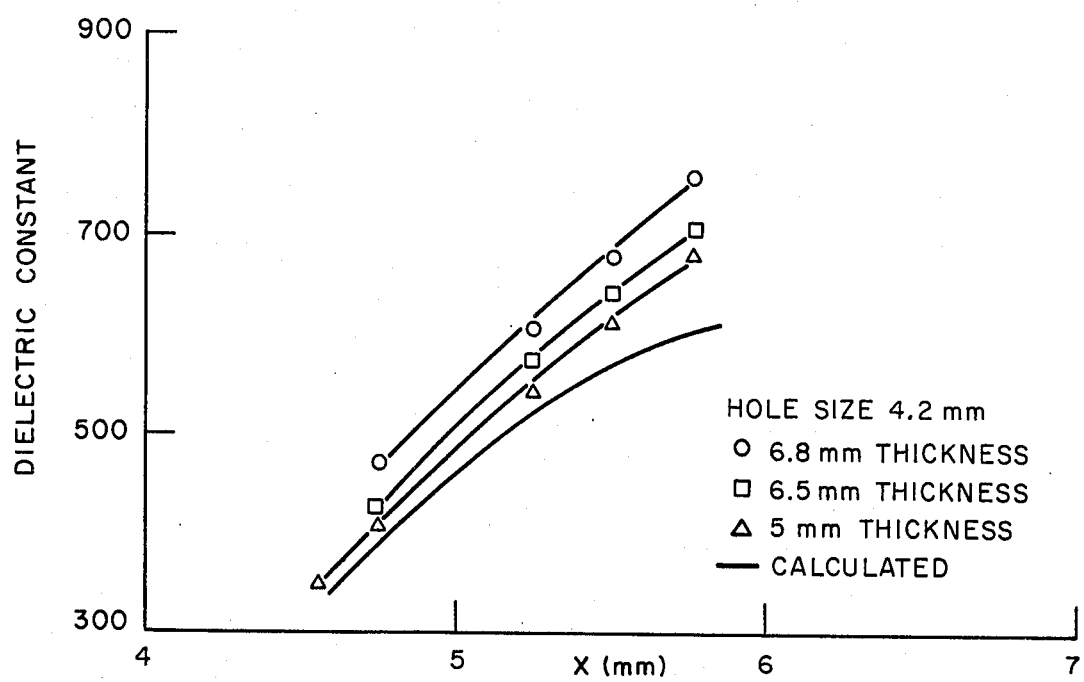
FIG. 4 is a graphical representation of variation of dielectric constant as a function of center-to-center distance between the adjacent holes for PZT polymer composites with 3-2 connectivity.
Figure 5:
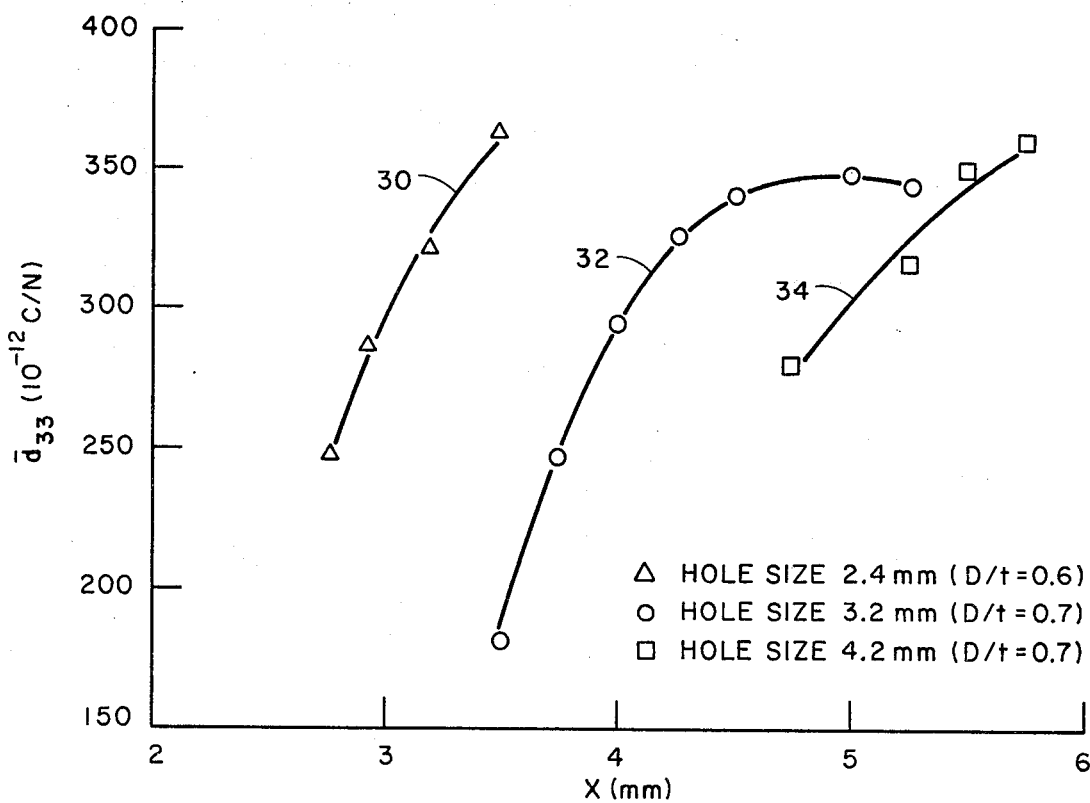
FIG. 5 is a plot of longitudinal piezoelectric coefficients $d_{33}$ as a function of center-to-center distance between the adjacent holes for PZT-polymer composites with 3-1 connectivity.
Figure 6:
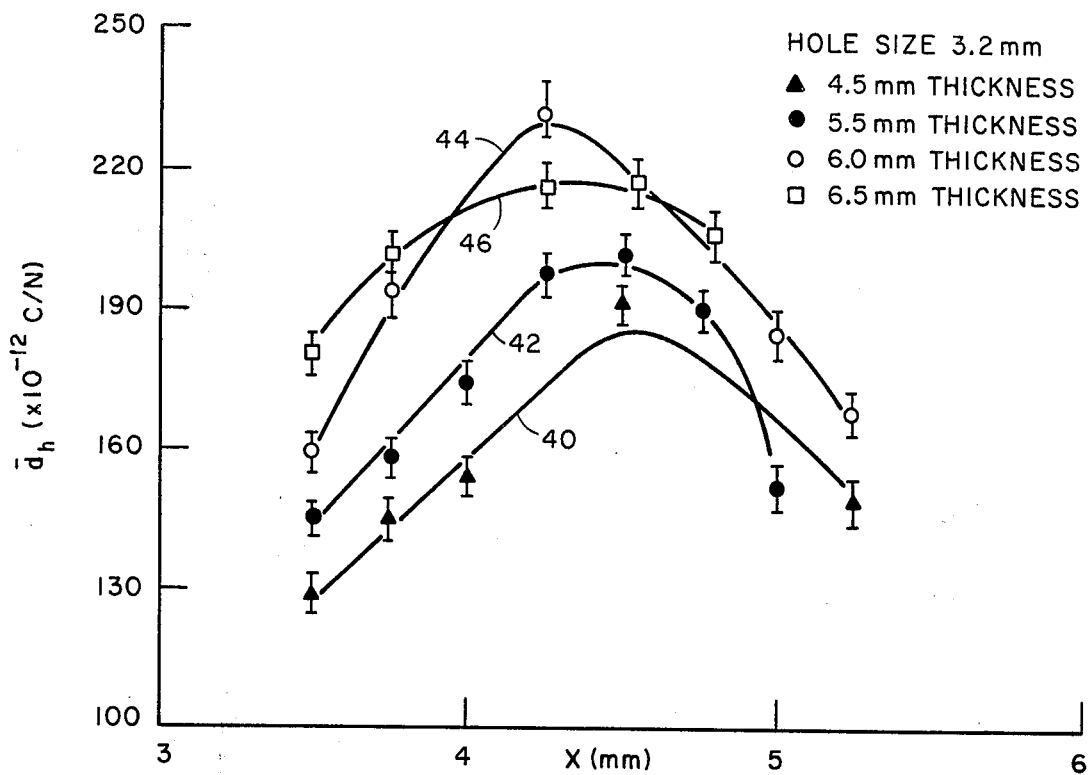
FIG. 6 is a graph of hydrostatic piezoelectric coefficient $d_h$ variation as a function of center-to-center distance between the adjacent holes for the composites with 3-1 connectivity.
Figure 7:
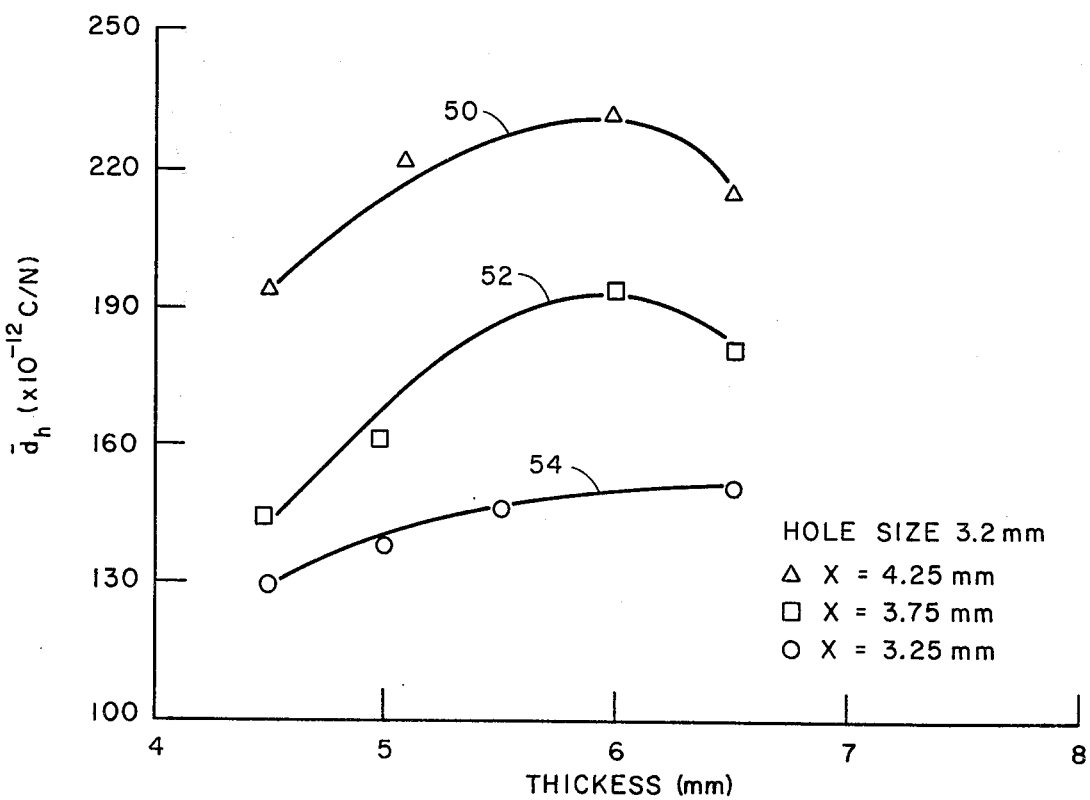
FIG. 7 is a graphical representation of dependence of $d_h$ on the thickness of the composites with 3-1 connectivity.

The dielectric constants and loss factors of all the samples were measured at a frequency of 1 KHz using an automated capacitance bridge such as Model No. 4270, Hewlett Packard Automated Capacitance Bridge. Piezoelectric coefficient $d_{33}$ was measured using a $d_{33}$ meter such as Berlincourt (Model No. 333) $d_{33}$ meter, Channel Products, Inc., 16722 Park Circle Drive, Chagrin Falls, Ohio). The hydrostatic piezoelectric coefficient $d_h$ was measured by pseudo static method using Keithley (Model No. 616) digital electrometer. Samples were immersed in an oil filled cylinder and pressure was applied at a rate of 3.5 MPa/second. The resulting charge was collected with a Keithley electrometer operated in a feedback charge integration mode. Various piezoelectric voltage coefficients were then calculated from the measured values of $d_{33}$, $d_h$ and $K_{33}$. The results of these parameter variations as a function of hole size and hole separation (i.e. center-to-center distance between adjacent holes) are shown in various graphical representations. FIGS. 3 and 4 show variation of dielectric constant as a function of X, center-to-center distance between two adjacent holes 14 and 16, for different sample for hole sizes of 3.2 mm and 4.2 mm, respectively. For example, curves 20, 22 and 24 of FIG. 3 are for samples of thickness 4.5 mm, 5.5 mm and 6 mm, respectively with hole size of 3.2 mm diameter and curve 26 is a theoretically calculated value of the dielectric constant as a function of X, the center-to-center hole separation as shown in FIG. 1. FIG. 4 depicts a similar comparison for hole size of diameter 4.2 mm. FIG. 5 indicates variation of piezoelectric constant $d_{33}$ as a function hole separation X between two adjacent holes, wherein curves 30, 32 and 34 are for hole sizes of diameter 2.4 mm, 3.2 mm and 4.2 mm, respectively. FIG. 6 is a graphical variation of $d_h$ as a function of X, center-to-center between two adjacent holes wherein curves 40, 42, 44 and 46 are for hole size of diameter 3.2 mm and sample thickness of 4.5 mm, 5.5 mm, 6.0 mm and 6.5 mm, respectively. FIG. 7 shows graphical variation of $d_h$ plotted as a function of thickness of the sample wherein curves 50, 52 and 54 thereof are for hole size 4.25 mm, 3.75 mm and 3.25 mm, respectively.

There are thus described PZT-polymer composites which are fabricated according to the teachings of subject invention. The fabrication is accomplished by drilling holes in sintered PZT blocks and filling partially or completely the holes with epoxy or some other inactive polymer. This decouples the piezoelectric $d_{33}$ and $d_{31}$ coefficients in the composites and enhances the hydrostatic coefficients.

Many modifications and variations of the presently disclosed invention are possible in the light of the above teachings. As an example, various inactive polymers can be used for filling the holes in the PZT sample. Furthermore, the size of the holes and the distance therebetween can be varied without deviating from the teachings of the subject invention. It is, therefore, to be understood that within the scope of the appended claims, the invention may be practiced otherwise than as specifically described.

What is claimed is:

1. A PZT-polymer composite material of 3-1 connectivity which comprises:
   a matrix of PZT;
   means for electrically poling said matrix of PZT; and
   a plurality of generally parallel voids partially filled with an inactive polymer in said matrix of PZT, said voids partially filled of the inactive polymer having axes thereof perpendicular to the direction of polarization of said matrix of PZT.

2. The PZT-polymer composite of claim 1 which has 3-2 connectivity having a first plurality of generally parallel voids partially filled with the inactive polymer having the axes thereof perpendicular to the direction of polarization of said PZT matrix and a second plurality of generally parallel voids partially filled with the inactive polymer having axes thereof perpendicular to the axes of said first plurality of voids and the direction of polarization of said PZT matrix.

3. The PZT-polymer composite of claim 1 wherein said plurality of voids in said PZT matrix are completely filled with the inactive polymer.

4. The PZT-polymer composite of claim 2 wherein said first plurality of voids and said second plurality of voids are completely filled with the inactive polymer.

5. The PZT-polymer composite of claim 1 wherein said plurality of voids partially filled with the inactive polymer are dispersed throughout said matrix of PZT.

6. The PZT-polymer composite of claim 2 wherein said first plurality of voids and said second plurality of voids in said PZT matrix are dispersed throughout said PZT matrix.

7. The PZT-polymer composite of claim 1 wherein said plurality of voids in said PZT matrix are of variable diameter for obtaining desired characteristic of said PZT-polymer composite.

8. The PZT-polymer composite of claim 2 wherein said first plurality of voids and said second plurality of voids in said PZT matrix are of variable diameter to effectuate desired characteristics.

9. The PZT-polymer composite of claim 7 wherein said plurality of voids in said PZT matrix have variable center-to-center distance between the adjacent voids of the same group.

10. The PZT-polymer composite of claim 8 wherein said first plurality of voids and second plurality of voids in said PZT matrix have variable center-to-center distance between the adjacent voids in each of said first plurality and said second plurality of voids.

* * * * *